(12) United States Patent
Zoellin et al.

(10) Patent No.: US 8,902,604 B2
(45) Date of Patent: Dec. 2, 2014

(54) COMPONENT SUPPORT AND ASSEMBLY HAVING A MEMS COMPONENT ON SUCH A COMPONENT SUPPORT

(75) Inventors: Jochen Zoellin, Stuttgart (DE); Ricardo Ehrenpfordt, Korntal-Muenchingen (DE); Ulrike Scholz, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 201 days.

(21) Appl. No.: 13/402,321

(22) Filed: Feb. 22, 2012

(65) Prior Publication Data
US 2012/0212925 A1 Aug. 23, 2012

(30) Foreign Application Priority Data

Feb. 23, 2011 (DE) .......................... 10 2011 004 577

(51) Int. Cl.
| | |
|---|---|
| H05K 1/18 | (2006.01) |
| H04R 25/00 | (2006.01) |
| H04R 9/08 | (2006.01) |
| H04R 11/04 | (2006.01) |
| H04R 17/02 | (2006.01) |
| H04R 19/04 | (2006.01) |
| H04R 21/02 | (2006.01) |
| G01L 19/00 | (2006.01) |
| B81B 7/00 | (2006.01) |
| G01L 19/14 | (2006.01) |
| H04R 19/00 | (2006.01) |
| H04R 1/08 | (2006.01) |

(52) U.S. Cl.
CPC .......... *H04R 19/005* (2013.01); *B81B 2207/096* (2013.01); *H04R 19/04* (2013.01); *H04R 1/086* (2013.01); *G01L 19/0084* (2013.01); *B81B 2201/0257* (2013.01); *B81B 7/007* (2013.01); *G01L 19/141* (2013.01); *B81B 2207/097* (2013.01); *B81B 2201/0264* (2013.01); *B81C 2203/0109* (2013.01); *B81B 2207/012* (2013.01)
USPC ............................ 361/761; 381/175; 381/355

(58) Field of Classification Search
None
See application file for complete search history.

(56) References Cited

U.S. PATENT DOCUMENTS

| | | | | |
|---|---|---|---|---|
| 6,031,922 | A * | 2/2000 | Tibbetts ........................ | 381/313 |
| 7,072,482 | B2 * | 7/2006 | Van Doorn et al. ........... | 381/355 |
| 7,166,910 | B2 * | 1/2007 | Minervini ..................... | 257/704 |
| 7,171,012 | B2 * | 1/2007 | Izuchi et al. .................. | 381/174 |
| 7,646,092 | B2 * | 1/2010 | Saitoh et al. .................. | 257/704 |
| 8,184,845 | B2 * | 5/2012 | Leidl et al. .................... | 381/369 |
| 8,295,515 | B2 * | 10/2012 | Kuratani et al. .............. | 381/175 |
| 8,306,252 | B2 * | 11/2012 | Dinh et al. .................... | 381/365 |
| 2003/0021095 | A1 * | 1/2003 | Kozaki .......................... | 361/761 |
| 2004/0047486 | A1 * | 3/2004 | Van Doorn et al. ........... | 381/355 |
| 2005/0009246 | A1 * | 1/2005 | Enquist et al. ................ | 438/127 |

(Continued)

*Primary Examiner* — Hoa C Nguyen
*Assistant Examiner* — Xanthia C Cunningham
(74) *Attorney, Agent, or Firm* — Kenyon & Kenyon LLP

(57) ABSTRACT

A component support allows cost-effective, space-saving and low-stress packaging of MEMS components having a sensitive structure. The component support is suited, in particular, for MEMS components, which are mounted in the cavity of a housing and are intended to be electrically contacted. The component support is produced as a composite part in the form of a hollow body open on one side, the composite part being made essentially of a three-dimensionally shaped carrier foil flexible in its shaping, and an encasing material. The encasing material is molded onto one side of the carrier foil, so that the carrier foil is situated on the inner wall of the component support. At least one mounting surface for at least one component is formed on the inner wall having the carrier foil. The carrier foil is also provided with contact surfaces and insulated conductive paths for electrically contacting the at least one component.

15 Claims, 2 Drawing Sheets

(56) References Cited

U.S. PATENT DOCUMENTS

| | | | |
|---|---|---|---|
| 2005/0018864 A1* | 1/2005 | Minervini | 381/175 |
| 2005/0121413 A1* | 6/2005 | Weekamp | 216/13 |
| 2006/0151203 A1* | 7/2006 | Krueger et al. | 174/260 |
| 2007/0058826 A1* | 3/2007 | Sawamoto et al. | 381/174 |
| 2007/0158826 A1* | 7/2007 | Sakakibara et al. | 257/723 |
| 2007/0205492 A1* | 9/2007 | Wang | 257/659 |
| 2007/0279876 A1* | 12/2007 | Weiblen et al. | 361/752 |
| 2008/0164545 A1* | 7/2008 | Hsiao | 257/416 |
| 2008/0175425 A1* | 7/2008 | Roberts et al. | 381/361 |
| 2008/0247585 A1* | 10/2008 | Leidl et al. | 381/360 |
| 2008/0283988 A1* | 11/2008 | Huang et al. | 257/680 |
| 2008/0310663 A1* | 12/2008 | Shirasaka et al. | 381/355 |
| 2008/0315230 A1* | 12/2008 | Murayama | 257/98 |
| 2008/0315333 A1* | 12/2008 | Combi et al. | 257/415 |
| 2009/0016550 A1* | 1/2009 | Qiao | 381/175 |
| 2009/0080682 A1* | 3/2009 | Ogura et al. | 381/355 |
| 2009/0127697 A1* | 5/2009 | Pahl | 257/698 |
| 2009/0136064 A1* | 5/2009 | Suzuki et al. | 381/174 |
| 2009/0175477 A1* | 7/2009 | Suzuki et al. | 381/355 |
| 2009/0257614 A1* | 10/2009 | Mei et al. | 381/355 |
| 2009/0267223 A1* | 10/2009 | Wachtler et al. | 257/710 |
| 2010/0224880 A1* | 9/2010 | Kimura | 257/59 |
| 2011/0293126 A1* | 12/2011 | Maekawa et al. | 381/355 |

* cited by examiner

COMPONENT SUPPORT AND ASSEMBLY HAVING A MEMS COMPONENT ON SUCH A COMPONENT SUPPORT

RELATED APPLICATION INFORMATION

The present application claims priority to and the benefit of German patent application no. 10 2011 004 577.5, which was filed in Germany on Feb. 23, 2011, the disclosure of which is incorporated herein by reference.

FIELD OF THE INVENTION

The present invention relates generally to the packaging of MEMS components having a sensitive structure and to the construction of assemblies having such a MEMS component and a housing. In particular, the present invention relates to a component support for MEMS components, which are intended to be mounted in the cavity of a housing and electrically contacted.

BACKGROUND INFORMATION

The related art is discussed, using the packaging of a MEMS microphone component as an example, without limiting the present invention to this particular application case.

It is known that substrate-based housings may be used for the packaging of MEMS microphone components. In this packaging variant, the microphone chip is mounted onto a planar component support referred to as a substrate, electrically contacted, and housed with a cover, using chip-on-board (COB) technology. If the sound entrance port is situated in the cover of the housing, then the back-side volume is limited, as a rule, to the chip cavity, which means that the microphone performance is also limited. As an alternative to that, the sound entrance port may be formed under the microphone chip, in the component support. In this case, the entire cavity in the housing is available as back-side volume, which allows an increase in performance to be obtained.

Regardless of application-specific requirements, the known packaging concept has proven to be problematic in two different respects.

Thus, in practice, mechanical stresses often occur in the sensitive structure of the MEMS component, which are dependent on mounting and may be attributed to different thermal expansion coefficients of, on one hand, the MEMS component and, on the other hand, the component support. Such mechanical stresses always affect the performance reliability of a MEMS component.

Since the known packaging concept provides side-by-side mounting of the components on the planar component support, the footprint of the assembly also increases with the number of components inside the housing. However, increasing the area of the assembly always leads to an increase in production costs, as well.

SUMMARY OF THE INVENTION

The exemplary embodiments and/or exemplary methods of the present invention are discussed below, using the packaging of a MEMS microphone component as an example, without limiting the exemplary embodiments and/or exemplary methods of the present invention to this particular application case.

The exemplary embodiments and/or exemplary methods of the present invention provide a component support, which allows cost-effective, space-saving and low-stress packaging of MEMS components having a sensitive structure.

The component support of the exemplary embodiments and/or exemplary methods of the present invention is produced as a composite part in the form of a hollow body open on one side and is made essentially of a three-dimensionally shaped carrier foil flexible in its shaping, as well as of an encasing material, which is molded onto the carrier foil on one side so that the carrier foil is situated on the inner wall of the component support. At least one mounting surface for at least one component is formed there. In addition, the carrier foil is provided with contact surfaces and with insulated conductive paths for electrically contacting the at least one component.

Accordingly, the component support of the exemplary embodiments and/or exemplary methods of the present invention is essentially made up of two components that are also functionally different, namely, a foil that is flexible in its shaping and is intended as a support for contact surfaces and insulated conductive paths for electrically contacting the components, and an encasing material with the aid of which a dimensionally stable, three-dimensional housing part is produced. In accordance with the exemplary embodiments and/or exemplary methods of the present invention, these two units that may be prepared in a simple manner and independently of one another are combined to form a composite part. In this context, the carrier foil is shaped three-dimensionally, the encasing material only coming into physical contact with the back side of the carrier foil, and not with its front side, on or in which the sensitive conductive paths and electrical contacts are situated. Mechanically rigid and electrically contactable, chip populating regions on the carrier foil are first formed in adhesive connection with the cured casing material.

The component support of the present invention may be produced very easily by standard tools and standard methods, and therefore, also highly cost-effectively for multiple uses.

In a particularly advantageous method variant, the three-dimensional shaping of the carrier foil and the production of the composite made up of the carrier foil and the encasing material is carried out in one molding method step. To that end, a first molding tool part is used, whose shape corresponds to the desired three-dimensional shape of the inner wall of the component support, as well as at least one second molding tool part, which determines the shape of the outside of the component support. In this context, the carrier foil is simply inserted into the first molding tool part prior to pressing in the liquid molding material. In the simplest case, it is then pressed against the molding tool by the inflow of molding material. However, the carrier foil may also applied to the tool surface prior to the pressing-in of the molding material, by suction or directing air flow against it, or also by clamping sections of it to the tool surface. When the molding material is cured, an adhesive material bond between the molding material and the carrier foil is formed in this manner, the carrier foil now covering at least some regions of the inner wall of the component support. The adhesion between the carrier foil and the molding material may be additionally improved by adhesive layers on the carrier foil.

In this method variant, a polymer film in the first molding tool for tolerance adjustment or for preventing tool contamination may be omitted, since the carrier foil takes on this function. This simplifies the molding method.

To manufacture component supports of the present invention, molded plastic parts having the shape of the hollow body open on one side may also be initially produced, for example, in a standard molding method. Then, in a separate method step, the carrier film is applied to the inner wall of such a plastic part. Methods such as laminating or impressing are particularly suited for this. In this context, the carrier foil may extend over the entire inner wall of the molded plastic part or also over only individual regions of the inner wall.

At this point, it is also noted that the thermal properties of the material of the component support according to the present invention may be adapted highly effectively to those of the MEMS component, which means that mechanical and thermomechanical stresses in the MEMS component may be substantially reduced. For, in the case of the component support of the present invention, the encasing material, as the dominant bonding partner, determines the material properties of the composite part, while the effect of the carrier foil may be neglected. However, based on the thermal expansion coefficient, the encasing materials normally used are already adapted considerably better to the semiconductor material of MEMS components than rigid circuit boards.

In general, there are various options for producing a component support of the present invention, in particular, with regard to the shape of the hollow body open on one side and the layout of the carrier foil having the electrical terminals. In this context, the function and number of the components to be incorporated are to be considered first and foremost, but also the mounting location and the 2nd-level assembly of the MEMS packages necessary for this.

The inner wall of the component support of the present invention, which is lined with the carrier foil, may easily be formed to be trough-shaped, with a mounting surface for components in the base region. Since most assemblies include, besides the MEMS component, further components such as an ASIC for processing the sensor or microphone signal, as a rule, in addition to the mounting surface for the MEMS component, further chip-mounting regions or regions for the mounting of passive components having terminal pads and conductive paths for electrical contacting are situated on the inner wall of the component support of the present invention.

In a particularly advantageous specific embodiment of the component support according to the present invention, the inner wall formed in the shape of a trough includes at least one step, on which the mounting surface for components is formed. Such a step may extend circumferentially over the entire inner wall, or also over only a subsection of the inner wall, which subsection is then formed in the shape of a step and extends to two opposite sections of the inner wall. In this manner, chip-populating regions are made available on different levels of the component support. In this manner, e.g., differences in thicknesses of components on the component support may be compensated for, in order to simplify the electrical contacting of these components. The grouping of chip-populating regions on different levels also opens up the possibility of positioning several components in an overlapping manner, or even one over the other, without the component surfaces coming into physical contact. This is particularly important for MEMS components having a sensitive structure, since this normally has to be released in order to ensure the performance reliability of the MEMS component. By such stacking of components on the component support of the present invention, the lateral dimension of a MEMS package may be reduced considerably in comparison with classical side-by-side mounting.

Due to its three-dimensional design in the form of a hollow body open on one side, the component support of the present invention may be advantageously used as an integral part of a housing having a cavity for a MEMS component. Then, terminating the housing only requires a cover piece, which is joined to the open side of the component support. For example, a planar housing part may simply be used as a cover piece. In an advantageous variant of the component support of the present invention, at least one step that may be circumferential is formed in the upper edge region of the trough-shaped inner wall as a receptacle for such a cover piece. This simplifies the positioning of the cover piece when mounting it on the populated component support. In addition, this allows the joining surface between the component support and the cover piece to be increased in size, which has a favorable effect on the reliability or imperviousness of this connection.

MEMS components, such as pressure sensors, microphone and loudspeaker components, require access for media. Accordingly, the housings of such components are provided with at least one access opening. This may be situated in the cover piece. However, the component support of the present invention may also be provided with a through-hole.

The boundary conditions for the 2nd-level assembly at the mounting location of a MEMS package is predetermined by the packaging and the housing of the MEMS component. In this context, in particular, the arrangement and design of the electrical terminals for external contacting are of considerable importance.

If the open side of the component support is terminated by a planar cover piece and this side of the housing functions as a mounting side for the 2nd-level assembly, then it turns out to be advantageous when the carrier foil having the conductive paths not only extends over the trough-shaped inner wall of the component support, but also over a surface region of the component support on the mounting side of the housing. For, in this case, in addition to the conductive paths and contact surfaces for the components, the carrier foil may also be provided with terminal pads for external electrical contacting, which means that all of the wiring between the components of the assembly and the external contacting is run through the three-dimensionally shaped component support. In this variant, a cover piece may be used that has no electrical functionality at all, but is exclusively used for closing the housing. Since, in this case, the two housing parts only have to be mechanically connected to one another, the packaging is particularly simple.

However, as an alternative to the variants described above, the closed side of the component support of the present invention may also function as the mounting side for the 2nd-level assembly. For this case, the composite part of the component support of the present invention is advantageously provided with electrical through-plating, which starts out from the contact surfaces or conductive paths of the carrier foil and is run through the encasing material onto the outside of the composite part.

With regard to the manufacturing of the component support of the present invention in a molding method, the carrier foil should be as heat-resistant as possible and able to be effectively coated with a conductive material. Therefore, polyimide foils are particularly suited as a constituent of the carrier foil.

In certain applications, it is useful to electromagnetically shield the components. In this connection, it turns out to be advantageous to use a multilayered carrier foil, whose layer construction includes at least one metallic layer as electromagnetic shielding.

A molding material, whose thermal expansion coefficient is adapted to that of the semiconductor material of the components, may be used as an encasing material. The risk of contaminating conductive paths or contact surfaces on the carrier foil is not present in this case, since during the manufacture of the composite part, the molding material also does not come into contact with the front side of the carrier foil, on or in which the delicate conductive paths and contact surfaces are formed.

As already mentioned, the component support of the present invention may be used together with a further housing part, in order to provide a MEMS component with a closed housing. The further housing part may simply be a planar cover piece made out of a plastic material. However, the cover piece may also be made out of a metallically-coated plastic material, a metal, a semiconductor material or a metallically-coated semiconductor material, if electromagnetic shielding of the MEMS component is necessary. In many applications, it is recommended that the cover piece be joined to the component support in a media-tight manner. Such a joint between the component support and a cover piece may simply be produced, for example, with the aid of a suitable adhesive agent, or using a welded connection. However, as an alternative to a cover piece, a foil may also be used for terminating the cavity.

The component support of the present invention may be used particularly advantageously within the scope of packaging MEMS microphone components. For example, the microphone component may be mounted in the component support, through a port functioning as a sound opening. In this case, the front-side volume is very small, which improves the sound absorption of the diaphragm structure, while the entire cavity inside of the housing is available as back-side volume. The two contribute to effective microphone performance.

As already discussed above, there are various options for developing and refining the teaching of the present invention in an advantageous manner. In this regard, reference is made, on one hand, to the claims subordinate to the independent claims and, on the other hand, to the following description of several exemplary embodiments of the present invention in light of the figures. Although all of the exemplary embodiments refer to microphone assemblies, the present invention is not limited to this application.

DETAILED DESCRIPTION

Figure 1:
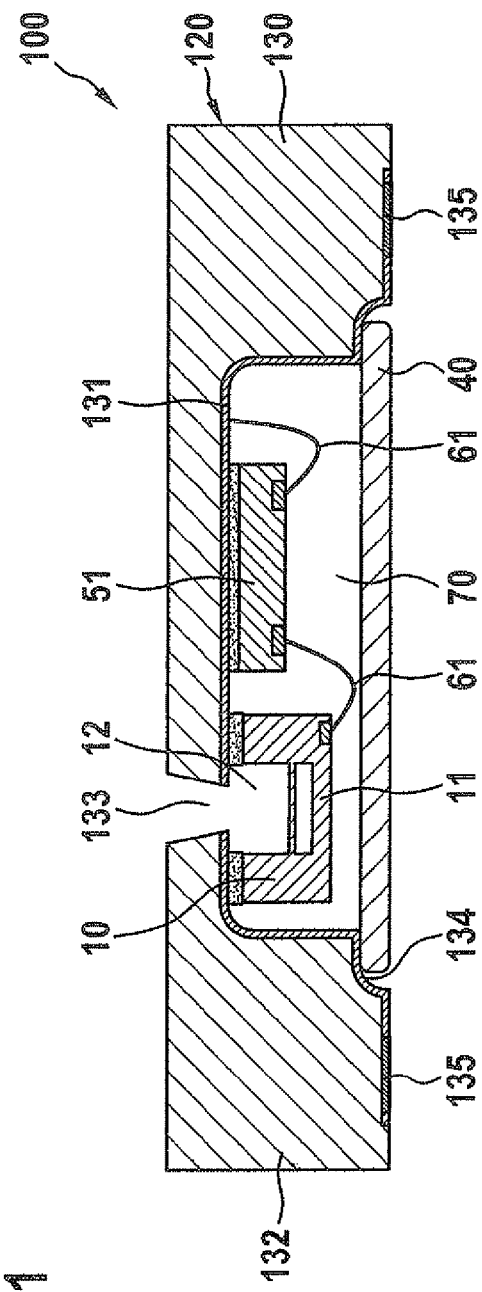
FIG. 1 shows a sectional view of a microphone assembly 100, whose housing includes a component support according to the present invention.

Microphone assembly 100 represented in FIG. 1 includes a MEMS microphone component 10, in whose front side a diaphragm structure 11 is formed that spans a cavity 12 in the back side of the component. MEMS microphone component 10 is situated in a housing 120 that includes two housing parts, namely, a component support 130 for the first-level packaging, which component support has the shape of a hollow body open on one side, and a planar housing cover 40 for terminating housing 120, which housing cover is situated on the mounting side of microphone assembly 100. Component support 130 is a composite part, which is essentially made up of a three-dimensionally shaped carrier foil 131 flexible in its shaping, and an encasing material 132, which is molded onto carrier foil 131 on one side, so that carrier foil 131 is situated on the inner wall of component support 130. The base region of the trough-shaped inner wall is used as a mounting surface for MEMS microphone component 10 and a further semiconductor component, in this instance, an ASIC 51 for processing the microphone signal. These components 10 and 51 are electrically contacted via wire bonds 61 and via contact surfaces and insulated conductive paths on or in carrier foil 131.

A port 133 that functions as a sound opening is formed in component support 130. MEMS microphone component 10 is mounted by its back side over sound opening 133 in a pressure-tight manner, so that diaphragm structure 11 is acted upon by the sound pressure via back-side cavity 12. In this case, the joint between the back side of the component and component support 130 was produced by adhesive bonding, but it could also be made by surface soldering. Flip-chip assembly of the MEMS microphone component 10 having diaphragm structure 11 is also conceivable via sound opening 133.

A circumferential step in the form of a receptacle 134 for planar housing cover 40 is formed in the upper edge region of the trough-shaped inner wall of component support 130. Housing cover 40 is joined to component support 130 in a pressure-tight manner, which means that the cavity inside housing 120 forms back-side volume 70 for MEMS microphone component 10. The joint between the two housing parts 130 and 40 may be produced, for example, by adhesive bonding or also laser welding.

Carrier foil 131 extends not only over the trough-shaped inner wall having step 134 in the upper edge region, but also onto the upper surface region of component support 130, which forms, together with planar housing cover 40, the mounting surface for the 2nd-level assembly of assembly 100. The insulated conductive paths on or in carrier foil 131 are run all the way into this upper surface region, where terminal contacts 135 are also situated on carrier foil 131 for external electrical contacting of assembly 10. Depending on the 2nd-level assembly method, terminal contacts 135 may be manufactured as LGA (land grid array) lands or also prepared for BGA (ball grid array) packaging.

Carrier foil 131 of component support 130 should be initially flexible in its shaping, as well as thermally stable. These requirements are satisfied by polyamide foils, for example. When the components need to be electromagnetically shielded, the use of multilayered foils having metallic layers insulated from one another for the electromechanical shielding and the electrically conductive paths and contact surfaces is recommended. A molding material, such as an epoxy material having $SiO_2$ fillers, may be used as an encasing material. Plastic, a metallically coated plastic, or also metal are possible materials for the housing cover. A housing cover made of, or having, metal contributes to the electromagnetic shielding of the microphone component, if it is connected to the microphone circuit with the aid of a conductive adhesive or a solder contact.

In the case of the microphone assembly 100 illustrated in FIG. 1, in spite of media opening 133 in component support 130, the delicate structure of MEMS component 10 is effectively protected from the ingress of foreign materials during the 2nd-level assembly of assembly 100, since sound opening 133 is situated on the side opposite to the mounting side of housing 120. Thus, vapors or condensation that are formed during reflow soldering may not reach the sensitive micromechanical structure of MEMS component 10 directly.

Given the same housing shape and component configuration as shown in FIG. 1, as an alternative, the sound opening may also be formed in the planar housing cover, on the mounting side of the microphone assembly. In this case, the sound would be guided through the cavity inside the housing, onto the microphone diaphragm. The back-side volume of the MEMS microphone component would be limited to the cavity between the diaphragm structure and the closed inner wall of the component support.

Figure 2:
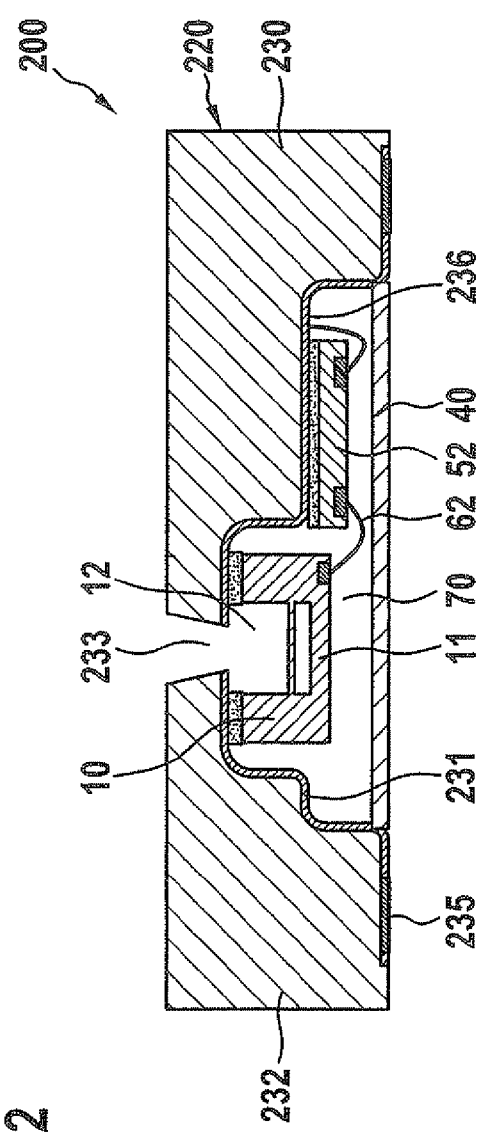
FIG. 2 shows a sectional view of a microphone assembly 200, whose housing includes a component support according to the present invention.

The microphone assembly 200 represented in FIG. 2 includes, as does the microphone assembly 100 represented in FIG. 1, a MEMS microphone component 10 in a housing 220 made up of a three-dimensionally shaped composite part of carrier foil 231 and encasing material 232 as component support 230, as well as of a planar housing cover 40. MEMS microphone component 10 is mounted over a sound opening 233 in the base region of the trough-shaped inner wall of component support 230 in a pressure-tight manner, which means that cavity 12 under diaphragm structure 11 is directly connected to sound opening 233 in component support 230. Planar housing cover 40 was positioned flush with the upper edge region of the trough-shaped inner wall of component support 230 and joined to it in a pressure-tight manner, in order to terminate housing 220 and, consequently, the back-side volume for MEMS microphone component 10.

A step 236, which, in contrast to microphone assembly 100, is not used as a receptacle for housing cover 40 but as a mounting surface for an ASIC 52, is formed in the trough-shaped inner wall of component support 230. Therefore, ASIC 52 is situated inside housing 220 on a level that is offset from MEMS component 10. In this manner, differences in thickness between components 10 and 52 may be compensated for, which simplifies the production of bond 62 between components 10 and 52. In addition, the two components 10 and 52 are electrically contacted via contact surfaces and insulated conductive paths on carrier foil 231 of component support 230. As in the case of microphone assembly 100, carrier foil 231 extends not only over the chip-mounting regions on the trough-shaped inner wall of component support 230, but also onto the upper surface region of component support 230, which forms, together with planar housing cover 40, the mounting surface for the 2nd-level mounting assembly of assembly 200. In this case as well, the wiring between components 10, 52 and the external electrical contacting on the mounting side of microphone assembly 200 is implemented exclusively via component support 230, i.e., via the carrier foil 231 of component support 230 that is provided with corresponding conductive paths and terminal contacts 235. Planar housing cover 40 is not used for this.

Three-dimensionally shaped component supports having chip-mounting surfaces on different levels, as illustrated in FIG. 2, offer the possibility of producing an overlapping or even stacked configuration of several components in place of a side-by-side configuration. In this manner, the required area of an assembly having several components may be markedly reduced.

Figure 3:
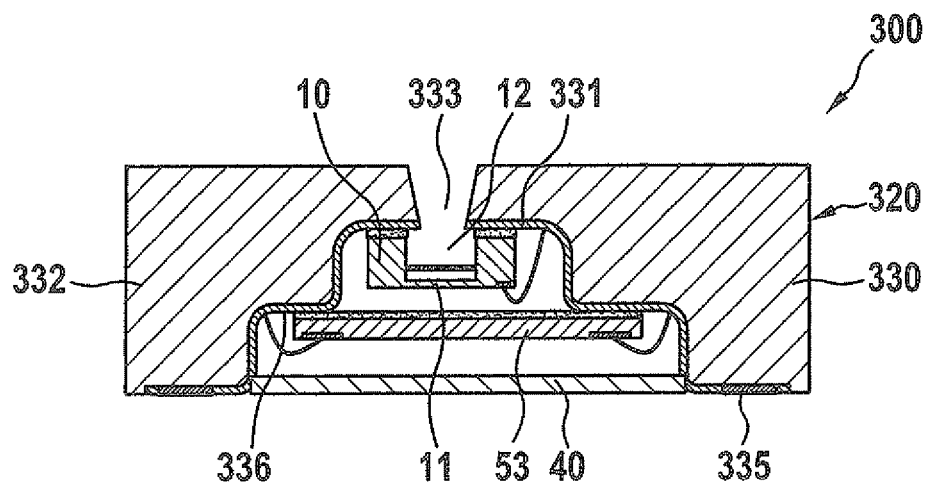
FIG. 3 shows a sectional view of a microphone assembly 300, whose housing includes a component support according to the present invention.

A microphone assembly 300 having such a component configuration is illustrated in FIG. 3. Microphone assembly 300 also includes a MEMS microphone component 10 in a housing 320, which is made up of a three-dimensionally shaped composite part in the form of a component support 330 and a planar housing cover 40. As in the above-mentioned exemplary embodiments, MEMS microphone component 10 is mounted over a sound opening 333 in the base region of the trough-shaped inner wall of component support 330 in a pressure-tight manner, which means that cavity 12 under diaphragm structure 11 is directly connected to sound opening 333 in component support 330.

A step 336, which is used as a mounting surface for an ASIC 53, is formed above MEMS microphone component 10, in the trough-shaped inner wall of component support 330. Step 336 may be circumferential or be situated only on two opposite sections of the inner wall. In each case, only the outer edge of ASIC chip 53 rests on mounting surface(s) 336 of component support 330, so that in this instance, ASIC 53 is situated above MEMS microphone component 10 and spaced apart from it. Thus, this type of stacking without boundary-surface contact between the two components 10 and 53 does not affect the performance reliability of MEMS microphone component 10.

If ASIC chip 53 is mounted on a circumferential mounting surface 336 in a pressure-tight manner, then the back-side volume of MEMS microphone component 10 is limited to the space between MEMS microphone component 10 and ASIC chip 53 Otherwise, that is, when ASIC chip 53 is mounted on two opposite steps 336 in the inner wall of component support 330, the back-side volume is terminated by planar housing cover 40, as in the case of microphone assembly 200, the planar housing cover being joined in a pressure-tight manner to the upper edge region of the trough-shaped inner wall of component support 330, so as to be flush with it.

In the case of microphone assembly 300, as well, the wiring between components 10, 53 and the external electrical contacting on the mounting side is implemented exclusively via component support 330. Accordingly, carrier foil 331 is provided both with insulated conductive paths and contact surfaces for the first-level packaging and terminal contacts 335 for the second-level packaging. It extends over the chip-mounting regions on the trough-shaped inner wall of component support 330, onto the upper surface region of component support 330, which forms, together with planar housing cover 40, the mounting surface for the 2nd-level assembly of assembly 300.

Figure 4:
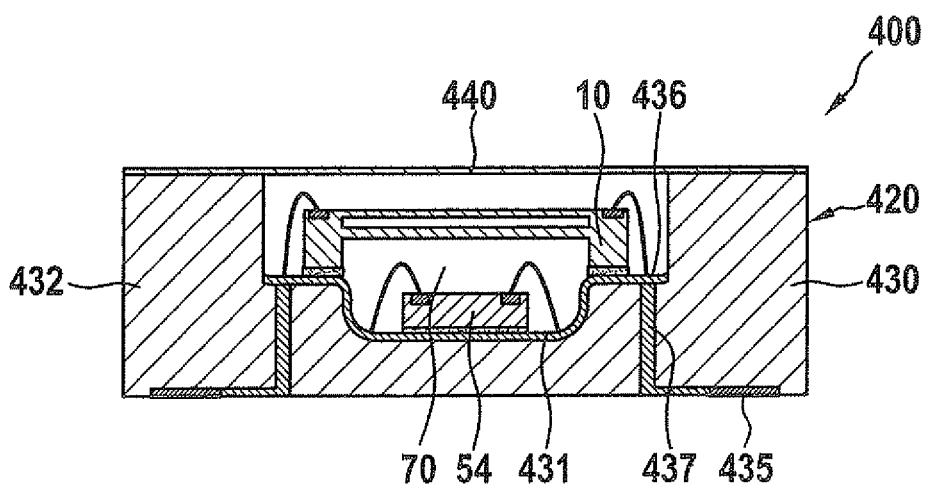
FIG. 4 shows a sectional view of a microphone assembly 400, whose housing includes a component support according to the present invention.

A microphone assembly 400 having a stacked configuration of MEMS microphone component 10 and ASIC chip 54 is illustrated in FIG. 4, as well. Housing 420 of this assembly 400 includes a composite part in the form of a component support 430, which is just as trough-shaped with a circumferential step 436 as component support 330 of microphone assembly 300. In the case of microphone assembly 400, ASIC chip 54 was positioned on the closed base region of the trough-shaped inner wall of component support 430. MEMS component 10 was mounted over that, on step 436 of the inner wall of component support 430, spaced apart from ASIC chip 54. In this context, the back side of the component was circumferentially joined to component support 430 in a pressure-tight manner.

In this case, the sound acts via an acoustically permeable foil 440, which was applied to the open side of populated component support 430 in place of a housing cover. It acts as a membrane and thus contributes towards improving the microphone performance. In addition, it protects components 10 and 54 on component support 430 from external influences and environmental effects. Such a foil may be laminated, stamped, welded, or also cemented onto component support 430. In the case of this construction, back-side volume 70 is limited to the space between diaphragm structure 11 and the closed base region of the inner wall of component support 530.

Since microphone assembly 400 is installed via the closed side of component support 430, at its location of use, the carrier foil 431 having the insulated conductive paths and electrical contact surfaces for the first-level packaging extends only over the chip-mounting regions in the base region and over circumferential step 435 of the inner wall of component support 435. To electrically contact microphone assembly 400 within the scope of the 2nd-level assembly, component support 430 was provided with electrical vias 437, which start out from the contact surfaces or conductive paths on or in carrier foil 431 and are run through encasing material 432 to electrical terminal contacts 435, onto the outside of composite part 430.

What is claimed is:

1. A component support, for at least one MEMS component, which is mounted in the cavity of a housing and electrically contacted, comprising:
    a component support arrangement, including:
    a composite part that is essentially made up of a three-dimensionally shaped carrier foil flexible in its shaping and an encasing material, which is molded onto the carrier foil on one side, so that the carrier foil is situated on the inner wall of the component support arrangement; and
    at least one mounting surface for at least one component, wherein the at least one mounting surface is formed on the inner wall having the carrier foil;
    wherein the carrier foil has contact surfaces and insulated conductive paths for electrically contacting the at least one component,
    wherein the component support is produced as the composite part in the form of a hollow body open on one side, and
    wherein the carrier foil extends along a first dimension and along a second dimension disposed at a non-zero angle to the first dimension, along surfaces of the composite part at different elevations from one another.

2. The component support of claim 1, wherein the inner wall having the carrier foil is formed in the shape of a trough having at least one step, so that mounting surfaces are formed on different levels of the inner wall.

3. The component support of claim 1, wherein the inner wall is formed in the shape of a trough having at least one step in the upper edge region, the step being used as a receptacle for a cover piece.

4. The component support of claim 1, wherein a port in the form of a media opening for the MEMS component is formed in the composite part.

5. The component support of claim 1, wherein the composite part is provided with electrical vias, which start out from the contact surfaces or conductive paths of the carrier foil and are run through the encasing material onto the outside of the composite part.

6. The component support of claim 1, wherein the carrier foil includes a polyimide foil.

7. The component support of claim 1, wherein the carrier foil is made up of a plurality of layers, and wherein the layer construction of the carrier foil includes at least one metallic layer as electromagnetic shielding for the at least one component.

8. The component support of claim 1, wherein the foil extends over a trough-shaped inner wall of the component support arrangement having a step in an upper edge region, and extends onto an upper surface region of the component support arrangement.

9. An assembly, comprising:
    a MEMS component having at least one sensitive structure; and
    a housing having a cavity, in which the MEMS component is situated, wherein the housing includes a component support which functions as a housing part;
    wherein the component support is for at least one MEMS component, which is mounted in the cavity of a housing and electrically contacted, and includes:
    a component support arrangement, including:
    a composite part that is essentially made up of a carrier foil, which is a three-dimensionally shaped carrier foil flexible in its shaping and an encasing material, which is molded onto the carrier foil on one side, so that the carrier foil is situated on the inner wall of the component support arrangement; and
    at least one mounting surface for at least one component, wherein the at least one mounting surface is formed on the inner wall having the carrier foil;
    wherein the carrier foil has contact surfaces and insulated conductive paths for electrically contacting the at least one component,
    wherein the component support is produced as the composite part in the form of a hollow body open on one side, and
    wherein the carrier foil extends along a first dimension and along a second dimension disposed at a non-zero angle to the first dimension, along surfaces of the composite part at different elevations from one another.

10. The assembly of claim 9, wherein the carrier foil of the component support extends onto the mounting side of the housing and has electrical terminals for externally contacting the assembly.

11. The assembly of claim 9, wherein the inner wall of the component support is stepped in a trough-like manner and has a plurality of mounting surfaces on different levels, and at least one further component is situated above or below the MEMS component by mechanically fixing it in position on at least one corresponding mounting surface and electrically contacting it.

12. The assembly of claim 9, wherein the housing includes a cover piece for terminating the cavity, the cover piece is made of a plastic material, a metallically-coated plastic material, a metal, a semiconductor material or a metallically-coated semiconductor material, and wherein the cover piece is joined to the component support in a media-tight manner.

13. The assembly of claim 9, wherein the housing includes a foil for terminating the cavity.

14. The assembly of claim 9, wherein the MEMS component includes at least one of a MEMS microphone component, a MEMS loudspeaker component, and a MEMS pressure sensor component.

15. The assembly of claim 9, wherein the foil extends over a trough-shaped inner wall of the component support arrangement having a step in an upper edge region, and extends onto an upper surface region of the component support arrangement.

* * * * *